INVENTORS:
HENRY P. BERGMAN
ROY W. STIEGLER, JR.
BY
John D. Graham
ATTORNEY

*INVENTORS:*
HENRY P. BERGMAN
ROY W. STIEGLER, JR.
*BY* John G. Graham
ATTORNEY

United States Patent Office 3,341,381

Patented Sept. 12, 1967

3,341,381

METHOD OF MAKING A SEMICONDUCTOR BY SELECTIVE IMPURITY DIFFUSION

Henry P. Bergman and Roy W. Stiegler, Jr., Dallas, Tex., assignors to Texas Instruments Incorporated, Dallas, Tex., a corporation of Delaware Continuation of application Ser. No. 359,886, Apr. 15, 1964. This application Oct. 24, 1966, Ser. No. 589,123
7 Claims. (Cl. 148—187)

ABSTRACT OF THE DISCLOSURE

Disclosed is a process for making transistors by depositing on a semiconductor substrate a coating of silicon oxide containing an impurity determining material, removing the oxide coating from the surface of the wafer from all portions except those in which the impurity is to be diffused, diffusing the impurity material into the substrate, and thereafter removing a portion of the impurity doped oxide and diffusing another impurity into the region formed by the first diffusion step.

This application is a continuation of application Ser. No. 359,886, filed Apr. 15, 1964, now abandoned.

This invention relates to methods of making semiconductor devices, and more particularly to methods of selectively diffusing impurities into semiconductor material.

Selective diffusions in silicon are ordinarily made by thermally growing silicon oxide on a semiconductor body, opening holes in the oxide above the regions to be doped, and thereafter exposing the masked semiconductor to an impurity-entrained vapor at high temperatures. The most common impurities used are boron and phosphorus, both of which are masked by silicon oxide so that selective diffusions are no problem. Also, low concentration diffusions are accomplished by first depositing a glaze of the impurity at a relatively low temperature then deglazing and firing at a higher temperature. This produces a lightly-doped diffused layer, the slight penetration during the deposition being used as a limited source. Another technique of obtaining a low concentration diffusion is to limit the concentration of impurity in the carrier gas by using a low source temperature or otherwise. All of these techniques, however, suffer from disadvantages in that there is undue sensitivity to oxygen and moisture in the carrier gas, or to non-unformity of the flow pattern of the carrier gas in the tube furnace. Also, the diffusion is very sensitive to the temperature of deposition and the temperature of the impurity source. In some cases, the exposed semiconductor surface is eroded at the high temperatures needed.

Gallium is preferable as a doping impurity in some devices where low temperature operation is necessary. For example, an NPN transistor which has gallium as the significant impurity in its base region displays superior beta characteristics at low temperatures, 77° K. and below. However, gallium is not masked by silicon oxide, and so a planar transistor cannot be made with a gallium-diffused base by conventional selective, diffusion techniques. Heretofore, mesa transistors have been made with gallium-diffused base regions, but the leakage characteristics of mesa units do not compare favorably with the planar construction.

It is therefore the principal object of this invention to provide improved methods of making selective diffusions into semiconductor material. Another object is to provide methods of selective diffusion wherein the impurity concentration may be controlled, and wherein low temperatures may be employed during the impurity deposition. Further, a primary object is to provide a method of making selective gallium diffusions in a planar-type semiconductor device.

In accordance with an embodiment of this invention, a layer of silicon oxide or the like containing an impurity such as gallium is deposited upon a semiconductor wafer, in contrast to being thermally grown, and the area of this layer is limited by removing part of the doped oxide with photomasking techniques. Thereafter, the wafer is subjected to diffusion temperatures, producing a selective diffusion. Due to the low temperatures at which the doped oxide may be deposited, and due to the ease of control of the amount of oxide and the amount of impurity therein, selective diffusions may be made in an expedient manner.

Preferably, the impurity-entrained oxide is deposited by pyrolytic decomposition, although other methods are appropriate. In another embodiment, a silicon oxide mask is used beneath the doped oxide, so that selective removal of the doped oxide is unnecessary.

The novel features believed characteristic of this invention are set forth in the appended claims. The invention itself, however, as well as further objects and advantages thereof, will best be understood by reference to the following detailed description of illustrative embodiments, when read in conjunction with the accompanying drawings, wherein:

Figure 1:
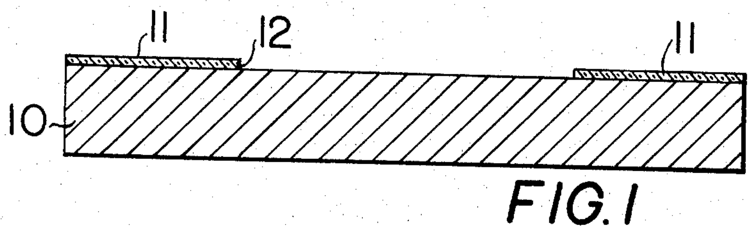
FIGURES 1, 3, 4 and 5 are elevational views in section of a semiconductor wafer at various stages of manufacture of a transistor in accordance with one embodiment of this invention.

With reference to FIGURE 1, there is shown a semiconductor wafer 10 which may be the starting material for practicing the process of this invention. The semiconductor material may be silicon, germanium, gallium arsenide, or the like. The wafer 10 would ordinarily be only a small undivided segment of a slice of semiconductor material of perhaps one inch in diameter cut from a grown crystal. In this manner, dozens or hundreds of like devices are made simultaneously. An oxide coating 11 is formed over the top surface of the wafer 10 (actually over the entire slice), and an opening 12 is formed in the oxide coating by photoresist masking and etching. The oxide coating 11 is not doped with impurity, but may be formed by the same method illustrated below except no impurity is included. Alternatively, the oxide coating 11 may be thermally grown if the wafer 10 is composed of silicon.

Figure 2:
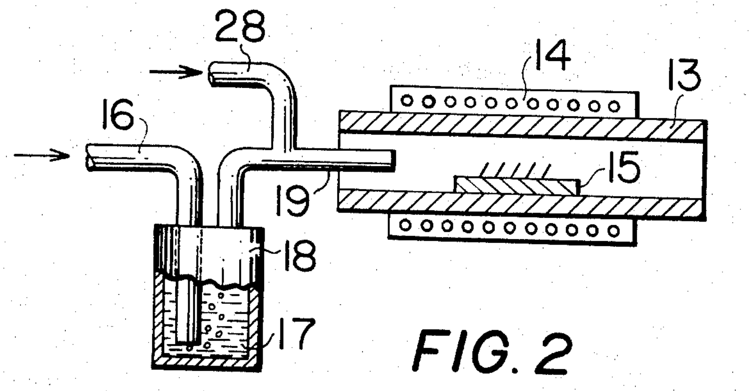
FIGURE 2 is a schematic representation partly in section of apparatus used for practicing this invention.

The masked wafer 10 is now subjected to a low temperature deposition of impurity-entrained silicon oxide such as may be carried out with the apparatus of FIGURE 2. This apparatus includes a tube furnace 13 which is maintained at the desired temperature by heater coils 14. Several of the semiconductor slices which include the structure of FIGURE 1 in undivided form are placed in the furnace in a boat 15. The reactant vapors are directed through the tube by forcing a carrier gas into an inlet 16, down through a siloxane liquid 17 in a flask 18, then into the tube through a conduit 19. In this manner, the carrier gas bubbles through the liquid 17 and transports the siloxane vapor into the tube, where decomposition of the siloxane occurs.

Within the furnace 13, the temperature is raised to a level at which the siloxane decomposes, but far below the melting point of the semiconductor and preferably far below the temperature at which significant diffusion of impurities would occur in the semiconductor body. Silicon melts at 1420° C. and germanium at 948° C., while most siloxanes decompose at about 600° C. or below, so many of the slioxanes are suitable for this purpose. In one example, the slices are heated in the furnace 13 to 535° C. for perhaps one hour while argon is used as the carrier gas to sweep the slioxane fumes through the furnace. In this case the siloxane liquid 17 is tetraethylorthosilicate, and the dopant may be any one of several liquids.

A dopant material is mixed with the liquid 17, and this material is also preferably in liquid form. If an N-type region is to be formed in silicon, this dopant liquid may be phosphorus oxychloride or phosphorus tribromide. For P-type diffusions, the dopant liquid may be boron tribromide or tripropylborate. The concentration of impurities in the deposited oxide is a function of the proportion of dopant liquid in the liquid 17. The volumes of liquids may be measured out and combined as the liquid 17. Once a bottle of tetraethylorthosilicate has been found to produce a desired dopant concentration, etc., it will remain stable and can be used routinely for an extended period of time with excellent reproducibility.

Figure 3:
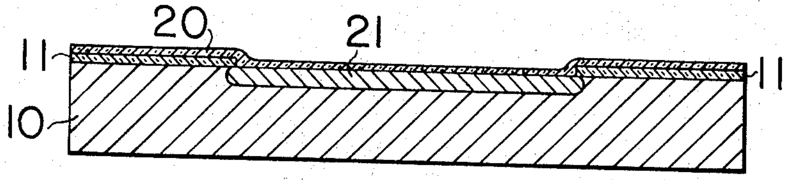

The wafer 10, when exposed to the deposition procedure set forth with reference to FIGURE 2, acquires a layer 20 as seen in FIGURE 3 of silicon oxide which is uniformly doped with boron or phosphorus, depending upon which dopant liquid is used. The doped oxide layer 20 extends down into the hole 12 where it contacts the semiconductor surface. In all other areas, it is spaced from the semiconductor surface by the undoped oxide layer 11 which acts as a diffusion mask. The wafer 10 with the doped layer 20 intact is placed in a furnace where the temperature is held at diffusion levels for a time sufficient to allow impurities to diffuse from the layer 20 into the semiconductor to form a diffused region 21 as seen in FIGURE 3. Ordinarily this region 21 is of conductivity-type opposite that of the remainder of the wafer, and the p-n junction formed thereby extends to the wafer surface beneath the oxide coating 11. If a planar transistor is being produced, the region 21 is the base region. If the semiconductor material of the wafer 10 is silicon, the temperature at which this diffusion step takes place is about 1200° C., while a diffusion temperature in the range of perhaps 700° C. to 800° C. would be employed for a germanium device. In either case, it is significant to note that the deposition temperature used is much lower, at a level where negligible diffusion takes place.

Figure 4:
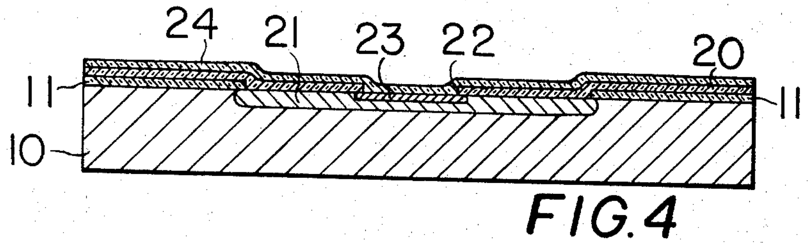

The diffused wafer is subjected to another photoresist masking and etching operation, whereupon a small opening 22 is formed in the oxide layer 20 as seen in FIGURE 4. Then, a diffused region 23 is formed by diffusion through the opening 22 using the oxide layer 20 as a mask. This diffusion operation may be accomplished by applying another layer 24 of oxide doped with a donor or acceptor impurity. The region 23, forming the emitter region of a transistor, is of conductivity type opposite that of the base region 21, and the p-n junction between the two extends to the wafer surface beneath the oxide layer 20.

Figure 5:
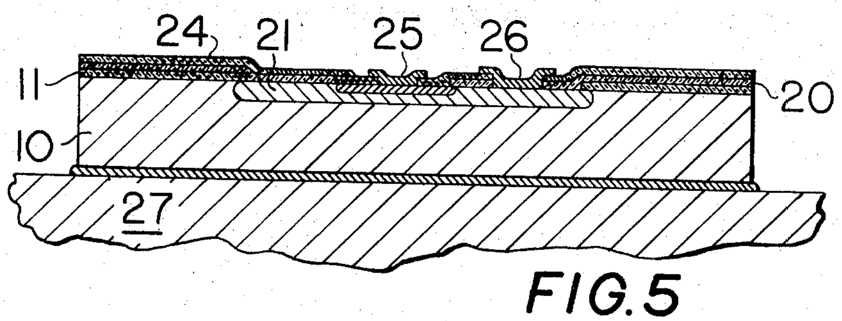

The structure of FIGURE 4 is an NPN or PNP transistor, depending upon the conductivity type of the starting material and the order in which P-type and N-type diffusions are made. The device is completed by opening holes in the oxide by photomasking and etching where contacts are to be made, depositing metal over the wafer face, then removing metal in unwanted areas by photomasking and etching, producing a structure as seen in FIGURE 5. An emitter contact 25 engages the region 23 and a base contact 26 the region 21. The lower face of the wafer is bonded to a metal header 27 which provides the collector contact for the transistor.

Specific examples of ratios of dopant liquid to siloxane will illustrate the high degree of control of diffusion permitted by this invention. If 50 parts of tetraethylorthosilicate, $(C_2H_5O)_4Si$, are mixed with one part $POCl_3$ and placed in the flask 18 which is held at room temperature, and the deposition is continued for one hour with the furnace temperature at 535° C., about 10,000 A. of doped silicon oxide will be deposited. A diffusion operation of one hour at 1200° C. is then performed, producing a junction depth of about 0.17 mil and an impurity concentration near the surface of about $10^{20}$ atoms/cc. Under the same conditions, but with a ratio of 500:1 between $(C_2H_5O)_4Si$ and $POCl_3$, the junction depth of 0.13 mil results and the concentration is about $10^{19}$. A ratio of 5000:1 produces a 0.12 mil junction depth and a concentration of $2\times10^{18}$ under these conditions. If $PBr_3$ is used as the dopant liquid in $(C_2H_5O)_4Si$ at a ratio of 12,500:1, with a one hour deposition and a 1½ hour diffusion, the junction depth is 0.09 mil and the concentration is about $1.5\times10^{17}$. In like manner, using 2500:1 ratio of tripropyl borate to $(C_2H_5O)_4Si$ produces a depth of 0.09 mil at $2\times10^{17}$ concentration, while a 250:1 ratio of these materials results in a 0.12 mil junction and a $3\times10^{18}$ concentration.

In the apparatus of FIGURE 2, the formation of silicon oxide on the wafer surface at relatively low temperatures may be enhanced by using oxygen as the carrier gas, and also by introducing an additional flow of oxygen through an inlet 28.

Figure 6:
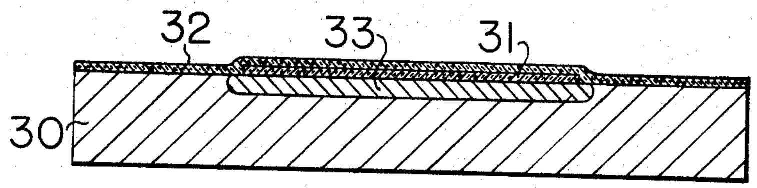
FIGURES 6 and 7 are elevational views in section of a semiconductor wafer at two stages in the manufacture of a transistor in accordance with a preferred embodiment of the invention.

In a preferred embodiment of the invention, a limited-area gallium diffusion may be accomplished by applying a doped oxide layer to a semi-conductor wafer and then removing portions of the oxide to eliminate the diffusion source in unwanted areas. To this end, an N-type semiconductor wafer 30 as in FIGURE 6 is coated with an oxide layer which contains gallium as an impurity. This may be accomplished using the apparatus of FIGURE 2 with a small amount of triethylgallium as the dopant in the tetraethylorthosilicate. It is imperative that this deposition be at far below diffusion temperature because otherwise it would be impossible to limit the diffusion area.

As an example, one part triethylgallium may be mixed with five parts $(C_2H_5O)_4Si$ and held at room temperature in the flask 18. The temperature in the furnace 13 is 500° C. In this case nitrogen is used as the carrier gas, and it is important that no oxygen gas be introduced because the triethylgallium is explosive. A one hour deposition, followed by a one hour diffusion at 1200° C. (after selective removal of the oxide) produces a junction 0.14 mil deep with a concentration of about $3\times10^{18}$ near the surface. Following the oxide deposition the area of the gallium-doped oxide layer is reduced by photomasking and etching, leaving a portion 31 of oxide on the top face of the wafer. This face is now covered with an undoped silicon oxide coating 32, preferably by the pyrolytic technique. With the oxide 32 in place, the wafer is subjected to diffusion temperature to produce a diffused region 33 which is doped with gallium from the oxide portion 31. As above, the junction extends to the wafer face under the oxide layer 32 and is thereby passivated. If a silicon device is being made, instead of forming the oxide layer 32 prior to diffusion, the layer may be formed by thermal growth during the gallium diffusion operation, in which case it would not extend over the layer 31.

Figure 7:
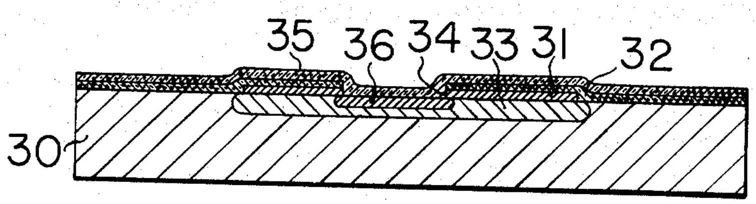

Referring now to FIGURE 7, the device of FIGURE 6 is completed by opening a hole 34 by photoresist techniques for the emitter diffusion. This emitter diffusion may be by conventional techniques, or alternatively a phosphorus-doped oxide layer 35 may be applied by the pyrolytic technique, and diffusion from this oxide performed to provide an N-type region 36. Contacts are applied and the transistor mounted as before.

Figure 8:
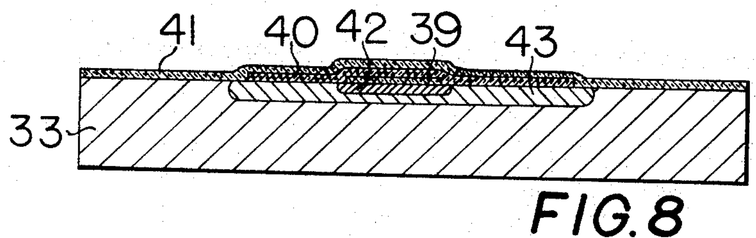
FIGURE 8 is an elevational view in section of a semiconductor wafer used in still another embodiment of the invention.

Since gallium is not masked by silicon oxide, the techniques of this invention permit a method of producing a planar transistor using only one diffusion operation. With reference to FIGURE 8, an N-type semiconductor wafer 38 is used as the starting material, and a phosphorus-doped oxide layer is applied to the top face by the pyrolytic technique described above, then the periphery of this layer is etched away by the photoresist method to leave a circular central portion 39 to act as the diffusion source for forming the emitter. A gallium-doped oxide layer is thereafter applied to the entire top face over the portion 39, and the area of this layer is reduced by photomasking and etching to leave a portion 40 which will act as the source for the base diffusion. The wafer is coated with an undoped oxide layer 41, and is subjected to diffusion temperatures for a time sufficient for the phosphorus to diffuse from the oxide portion 39 to form an N-type emitter region 42 and for the gallium to diffuse from the oxide portion 40 to create a P-type base region 43. This is possible because gallium diffuses much faster than phosphorus in silicon. Note that the central part of the base region is formed by gallium diffusing entirely through the oxide portion 39. As above, the NPN transistor of FIGURE 8 is completed by selectively removing oxide and applying base and emitter contacts, and by mounting on a metal header to provide the collector electrode.

In the drawings of the various embodiments, the thickness of the oxide layers relative to the wafers is greatly exaggerated. Also, it should be understood that the various diffused regions and oxide segments appear circular or rectangular in plan view and are spaced from the edges of the wafer.

Although the invention has been described with reference to illustrative embodiments, this description is not to be construed in a limiting sense. Upon reading this specification, various modifications of the disclosed embodiments, as well as other embodiments of the invention, will appear to persons skilled in the art, and so it is contemplated that the appended claims will cover any such modifications or embodiments as fall within the true scope of the invention.

What is claimed is:

1. A method of making a planar transistor having gallium as the impurity in the base region comprising the steps of providing a wafer of N-type semiconductor material, depositing at low temperature on one face of the wafer a coating of silicon oxide containing gallium, removing said oxide coating from said one face except in a centrally-located portion, subjecting said wafer to a high temperature to diffuse gallium from said portion into the wafer whereby a base region is produced, and thereafter removing a small centrally-located segment of said portion of gallium-doped oxide and diffusing a donor impurity into said base region to form an emitter region.

2. A method of making a planar transistor having gallium as the significant impurity in the base region comprising the steps of providing a wafer of N-type semiconductor material, depositing on one face of the wafer at low temperature from a silane vapor and a vapor of a gallium compound a coating of silicon oxide containing gallium, selectively removing said oxide coating from said one face to leave a portion of gallium-doped oxide intact, subjecting said wafer to a high temperature to diffuse gallium from said portion into the wafer whereby a base region is produced, and thereafter selectively removing a part of said portion of gallium-doped axide and diffusing a donor impurity into said base region to form an emitter region.

3. A method of making a silicon planar transistor having gallium as the impurity in the base region comprising the steps of providing a wafer of N-type silicon, depositing on a face of the wafer at low temperature from vapor of silane and a gallium compound a coating of silicon oxide containing gallium, removing said oxide coating from said one face except in a centrally-located portion, subjecting said wafer to a high temperature to diffuse gallium from said portion into the wafer whereby a base region is produced, removing a small part of said centrally-located portion of gallium-doped oxide, to expose a small part of the silicon surface diffusing a donor impurity into said small part of the silicon surface to form an emitter region within the base region.

4. A method according to claim 3 wherein the silane is tetraethylorthosilicate and said gallium compound is triethylgallium.

5. In a method of making a transistor, the steps of forming upon one face of a semiconductor wafer a first thin coating of oxide and impurity material of one conductivity determining type, the first coating being adjacent only a limited portion of the area of such face, forming upon said limited portion of the face a second thin coating of oxide and impurity material of opposite conductivity determining type, the second coating being adjacent a part of said face of the wafer much smaller in area than said limited portion, and thereafter subjecting the wafer to an elevated temperature to diffuse said impurity material of one type from the first coating into the face of the wafer to form a base region for the transistor and simultaneously therewith diffuse said impurity material of opposite type from the second coating into the face of the wafer to form an emitter region for the transistor, the emitter region penetrating into the wafer less than the base region.

6. A method of making adjacent opposite conductivity type zones in a semiconductor wafer comprising the steps of forming, upon one face of said semiconductor wafer, a first layer of oxide containing an impurity of one conductivity type, said first layer being adjacent only a limited portion of the area of said face, forming a second layer of oxide containing an impurity of opposite conductivity type upon at least a portion of said first layer and adjacent another limited portion of the area of said face of said semiconductor wafer, thereafter subjecting the wafer to an elevated temperature to diffuse said impurity of one type and said impurity of opposite type simultaneously into said semiconductor wafer to form said zones of opposite conductivity type, one zone penetrating into the wafer less than the other.

7. In a method for fabricating a transistor of the type having different conductivity type emitter and base zones in a semiconductor wafer with a P-N junction intermediate said emitter and base zones extending to a face of said wafer, the steps of:

forming a first impurity source layer providing impurities of one conductivity type at said face, said layer being adjacent a limited portion of the area of said face, providing a second source of impurities of opposite conductivity type adjacent at least a portion of said first layer and adjacent a limited portion of said face of said semiconductor wafer, and simultaneously diffusing said one conductivity type impurities and said opposite conductivity type impurities into said semiconductor wafer at an elevated temperature to form said emitter and base zones, the emitter region penetrating into the said wafer less than the base region.

References Cited

UNITED STATES PATENTS 3,200,019 9/1965 Scott ---------------- 148—187

HYLAND BIZOT, *Primary Examiner.*